United States Patent [19]
Takagi et al.

[11] Patent Number: 5,986,337
[45] Date of Patent: Nov. 16, 1999

[54] SEMICONDUCTOR ELEMENT MODULE AND SEMICONDUCTOR DEVICE WHICH PREVENTS SHORT CIRCUITING

[75] Inventors: Shinichi Takagi; Akinobu Suzuki, both of Tokyo, Japan

[73] Assignee: Mitsubishi Denki Kabushiki Kaisha, Tokyo, Japan

[21] Appl. No.: 09/138,562

[22] Filed: Aug. 24, 1998

[30] Foreign Application Priority Data

Nov. 17, 1997 [JP] Japan ................................. 9-315260

[51] Int. Cl.⁶ ................................................. H01L 23/48
[52] U.S. Cl. ...................... 257/693; 257/697; 257/730; 257/692
[58] Field of Search ................................. 257/697, 692, 257/693, 698, 730

[56] References Cited

U.S. PATENT DOCUMENTS

| | | |
|---|---|---|
| 4,868,638 | 9/1989 | Hirata et al. . |
| 5,398,165 | 3/1995 | Niinou . |
| 5,567,984 | 10/1996 | Zalesinski et al. . |

FOREIGN PATENT DOCUMENTS

| | | | |
|---|---|---|---|
| 62-163347 | 7/1987 | Japan | ................................. 257/697 |
| 63-174344 | 7/1988 | Japan | ................................. 257/697 |
| 1-39051 | 2/1989 | Japan | ................................. 257/697 |
| 1-60542 | 4/1989 | Japan | . |
| 2-29538 | 2/1990 | Japan | . |
| 4-146652 | 5/1992 | Japan | . |
| 4-199556 | 7/1992 | Japan | ................................. 257/697 |
| 5-102348 | 4/1993 | Japan | ................................. 257/693 |
| 5-144962 | 6/1993 | Japan | ................................. 257/697 |

OTHER PUBLICATIONS

Article issued by Ohm, "Handbook for Electronics and Communication Engineers," *Electric–Communication Hand Book,* dated Mar. 30, 1979, cover pages, and p. 577.

*Primary Examiner*—Sheila V. Clark
*Attorney, Agent, or Firm*—Burns, Doane, Swecker & Mathis, LLP

[57] ABSTRACT

A semiconductor element module includes a package, a semiconductor element arranged on the package, and a plurality of leads provided on sides of the package so that an opening end of each the lead is oriented to the side of a package attaching plane, and serving to connect the semiconductor element to an external circuit; wherein a level differences is provided on the side of the package attaching plane of each of package sides so that a space is formed from each the plurality of leads.

10 Claims, 6 Drawing Sheets

CONVENTIONAL

*FIG. 7A*

CONVENTIONAL

*FIG. 7B*

CONVENTIONAL

*FIG. 7C*

CONVENTIONAL
FIG. 8A

CONVENTIONAL
FIG. 8B

CONVENTIONAL
FIG. 9A

CONVENTIONAL
FIG. 9B

SEMICONDUCTOR ELEMENT MODULE AND SEMICONDUCTOR DEVICE WHICH PREVENTS SHORT CIRCUITING

BACKGROUND OF THE INVENTION

1. Field of the Invention

The present invention relates to a semiconductor element module and a semiconductor device.

2. Description of the Related Art

Figure 7A:
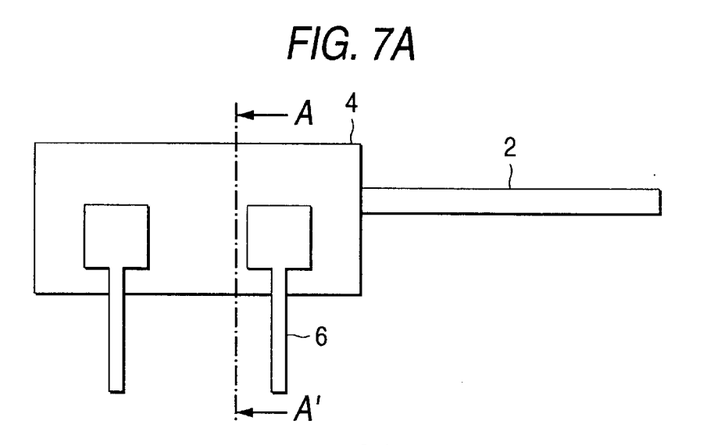
FIGS. 7A to 7C are a side view, a sectional view thereof and a front view taken in line A—A' of a conventional semiconductor module, respectively.
Figure 7B:
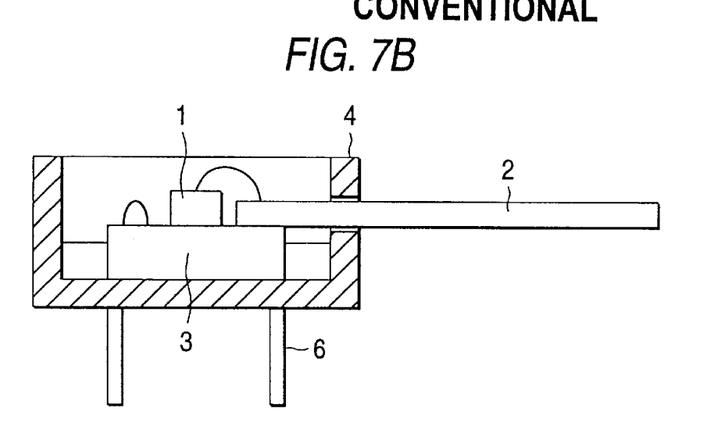
Figure 7C:
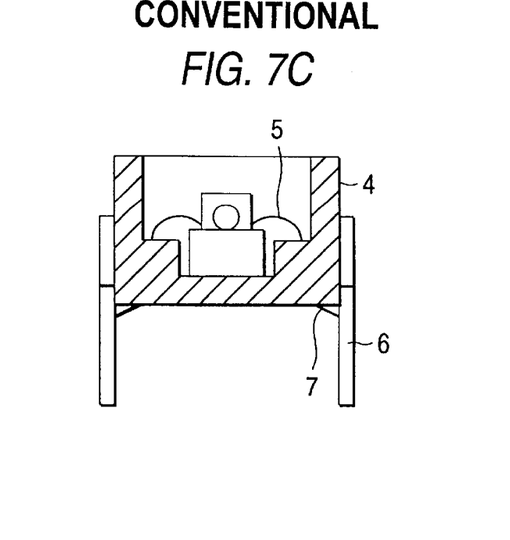

An explanation will be given of the case where a semiconductor element is an optical element (light emitting element, light receiving element). FIG. 7A is a side view of a conventional semiconductor element module; FIG. 7B is a side view of FIG. 7A; and FIG. 7C is a front view taken in line A—A' in FIG. 7A.

Figure 8A:
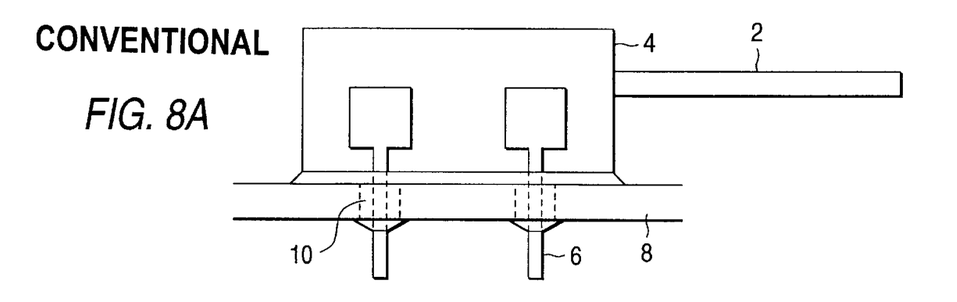
FIGS. 8A and 8B are a side view and a front view of a semiconductor device in which the conventional semiconductor module is mounted on a substrate through the through-holes formed therein, respectively.
Figure 8B:
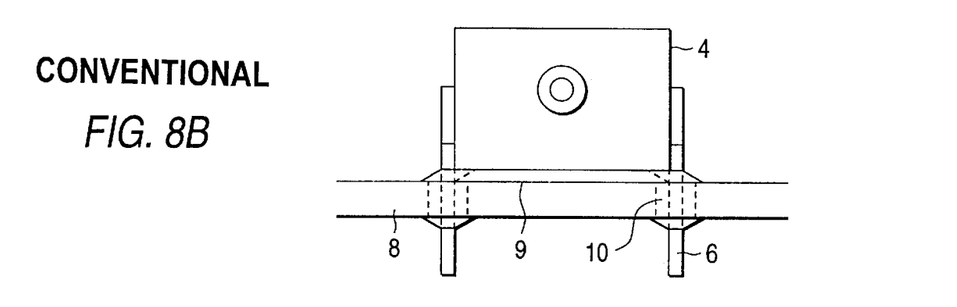
Figure 9A:
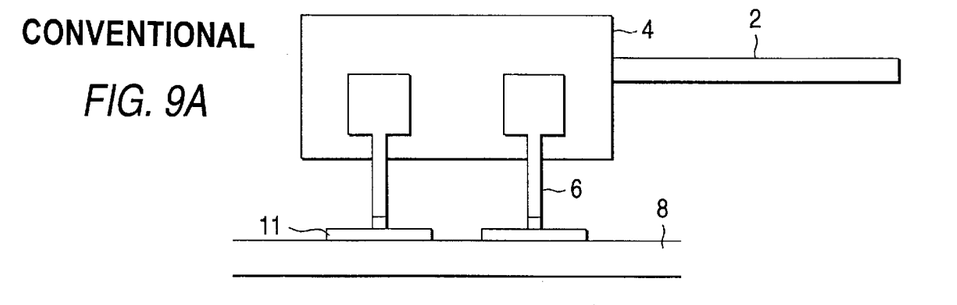
FIGS. 9A and 9B are a side view and a front view of a semiconductor device in which the conventional semiconductor element module is mounted on a substrate through the conductor patterns provided on the substrate, respectively.
Figure 9B:
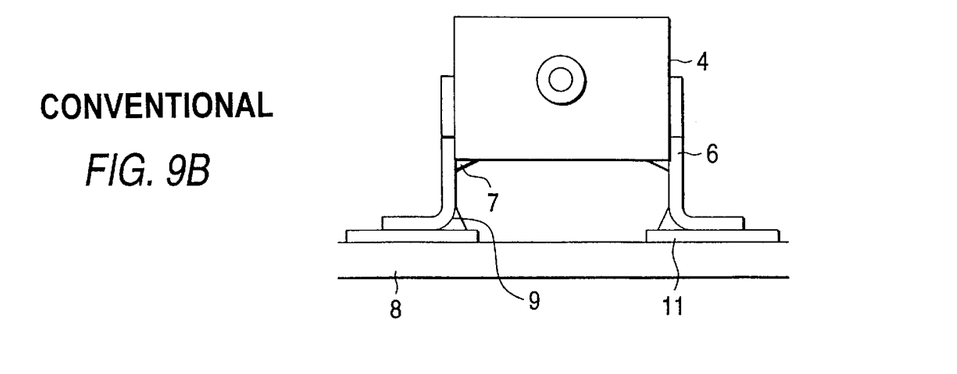

In these figures, reference numeral 1 denotes an optical element for converting an electric signal into an optical signal and vice versa; 2 an optical fiber for transmitting the optical signal; 3 a mount for adjusting/fixing the optical axes of the optical element 1 and optical fiber 2; 4 a package for hermetically sealing the optical element; 5 one of wires for connecting the optical element 1 and package 4; 6 one of leads, provided on both sides of the package 4 so that an opening end is oriented to the a package attaching plane, for connecting the optical element and external circuit; and 7 one of brazing materials for connecting the package and the leads 6. The wire 5 and leads 6 are electrically connected to each other through the package 4. FIG. 8A is a side view of a semiconductor device in which a conventional semiconductor element module is mounted on a substrate through through-holes formed in a substrate. FIG. 8B is a front view of FIG. 8A. In these figures, reference numeral 8 denotes a substrate on which a semiconductor element module is mounted; 9 a solder for mounting; and 10 one of through-holes made in the substrate 8. FIG. 9A is a side view of a semiconductor device in which a conventional semiconductor element module is mounted on a substrate through conductor patterns formed on a mounting surface of the substrate.

The conventional semiconductor element module and semiconductor device configured as described above has the following problems. When the semiconductor element module is mounted on the substrate 8 through the through-holes 10 made therein, the solder used for mounting (solder material used to solder the leads 6 through the through-holes 10) is molten owing to heating so that a part of the molten solder flows into a slight gap formed between a package bottom and substrate 8 by a capillary phenomemon, thus short-circuiting the leads 6 to each other. Further, when the semiconductor module is mounted on the substrate through the conductor patterns 11 mounted on the mounting surface of the substrate 8, the leads 6 must be shaped at a portion apart from the brazing materials 7 in order to maintain the connecting strength between the package 4 and leads 6. Since the brazing materials 7 are located at a position near the bottom of the package, in order to satisfy the above requirement, the leads 6 will be shaped (outward bending) at a portion thereof apart from the package bottom. This increases the height of the semiconductor device after mounting.

SUMMARY OF THE INVENTION

The present invention has been accomplished in order to solve the above problem, and intends to provide a semiconductor element module and a semiconductor device which can prevent solder for mounting from flowing into a slight gap formed between a package bottom and a substrate by a capillary phenomenon when the semiconductor element module is mounted on the substrate through through-holes formed therein, thus preventing the leads from being short-circuited with each other.

When the semiconductor element module is mounted on a substrate through a conductor pattern provided on a mounting surface of the substrate, the leads must be shaped at positions apart from the brazing material so that the connecting strength between the package and leads are not attenuated. When the brazing material is located at a position apart from the bottom of the package, the present invention intends to provide a semiconductor element module and a semiconductor device which permits the lead to be molded at a position near to the package bottom to lower the height after mounting.

To achieve the above object, the semiconductor element module according to the first invention is structured so that a level differences is provided on the side of the package attaching plane of each of package sides so that a space is formed from each the plurality of leads.

The semiconductor device according to the second invention is structured to include a semiconductor element module according to the first invention and a substrate having conductor patterns and through-holes for connecting the conductor patterns to each other wherein each the leads is soldered to the substrate through each the though-holes so that the bottom of the package abuts on a mounting plane.

The semiconductor device according to the third invention is structured so as to include a semiconductor element module according to the first invention and a substrate having conductor patterns for lead connection on a mounting plane thereof wherein each the leads is soldered to the substrate through each the conductor patterns so that the bottom of the package forms a prescribed space from the mounting plane.

The semiconductor element module according to the fourth invention is structured to further include brazing materials for connecting the package and each the leads and so that the level difference forms a space permitting each the leads to be shaped at its portion near to the package.

The semiconductor element module according to the fifth invention is structured so that the level-difference formed in the first or fourth invention serves to prevent the short-circuiting between the leads adjacent to each other.

The semiconductor element module according to the sixth invention is structured so that a level differences is provided at a portion of each the leads not connected to the package so that the width of each the leads on the side where the lead and package are connected is thick and that on the side of its opening end is thin.

The semiconductor device according to the seventh invention is constructed to includes a semiconductor element module according to the sixth invention and a substrate having conductor patterns and through-holes for connecting the conductor patterns to each other wherein each the leads is soldered to the substrate through each the though-holes so that the level difference of each the leads abuts on a mounting plane of the substrate.

The semiconductor device according to the eighth invention is structured so as to include a semiconductor element module according to the sixth invention and a substrate having conductor patterns for lead connection on a mounting plane thereof wherein each the leads is soldered to the substrate through each the conductor patterns so that the bottom of the package forms a prescribed space from the mounting plane of the substrate.

The semiconductor element module according to the ninth invention is structured to further include brazing materials for connecting the package and each the leads and so that the level difference provides different mechanical strengths permitting each the leads to be shaped at its portion near to the package.

The semiconductor element module according to the tenth invention is structured so that the level difference formed in the semiconductor element module according to the sixth or ninth invention serves to prevent the short-circuiting between the leads adjacent to each other.

The semiconductor element module according to the eleventh invention is structured so that the semiconductor element is an optical element.

DETAILED DESCRIPTION OF THE PREFERRED EMBODIMENTS

Now, a description will be given in more detail of preferred embodiments of the present invention with reference to the accompanying drawings.

Embodiment 1

Figure 1A:
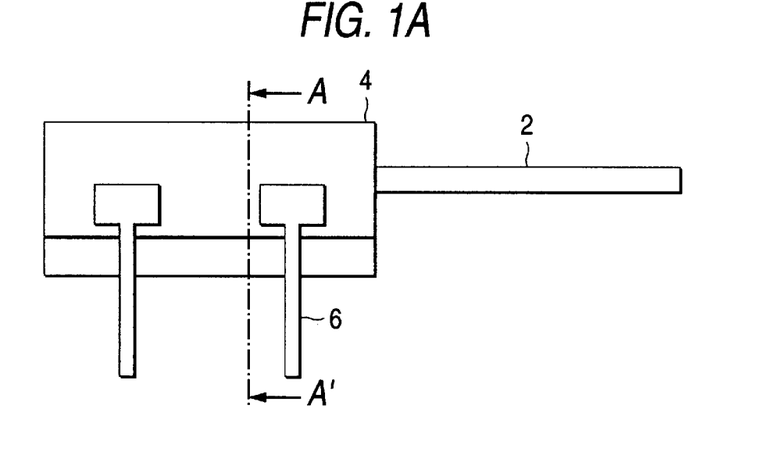
FIGS. 1A to 1C are a side view, a sectional view thereof and a front view taken in line A—A' of a semiconductor module according to a first embodiment of the present invention, respectively.
Figure 1B:
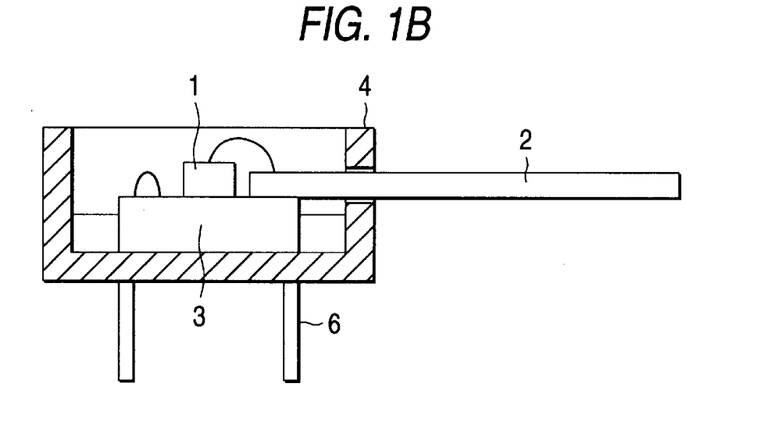
Figure 1C:
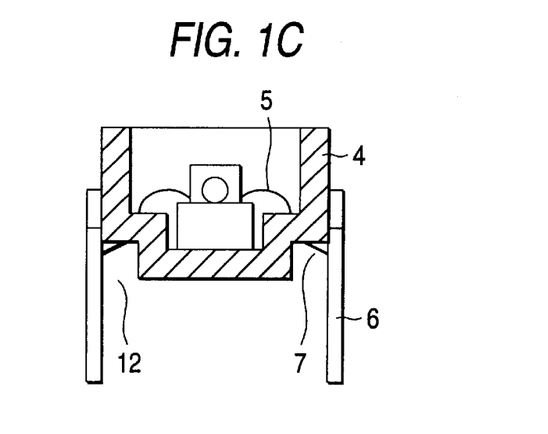
Figure 2A:
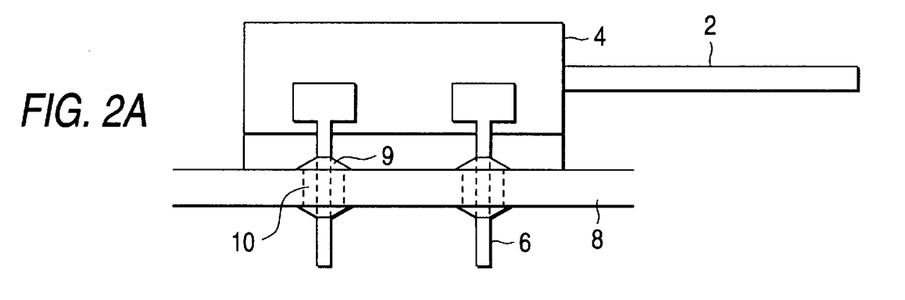
FIGS. 2A and 2B are a side view and a front view of a semiconductor device in which a semiconductor module according to the first embodiment is mounted on a substrate through the through-holes formed therein, respectively.
Figure 2B:
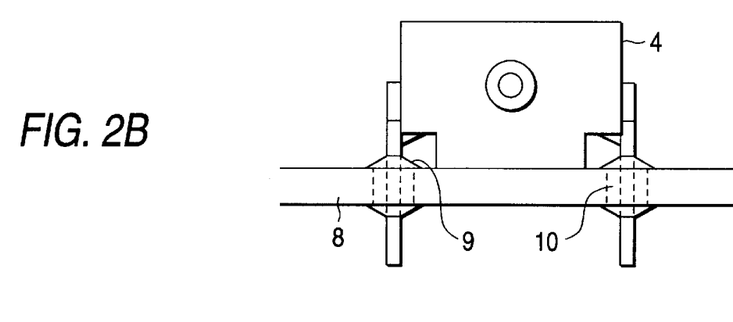

FIG. 1A is a side view of the first embodiment of the invention; and FIG. 1B is a sectional view of FIG. 1A; FIG. 1A is a front view taken along line A—A' in FIG. 1A. In these figures, reference numerals 1–7 refer to like parts in the conventional semiconductor module and semiconductor device. Reference numeral 12 denotes one of grooved level differences each forming a space between the lead 6 and the side of the package attaching plane of sides of the package. FIG. 2A is a side view showing a semiconductor device in which a semiconductor element module according to the present invention is mounted on a substrate through through-holes provided therein. FIG. 2B is a front view thereof. In these figures, reference numerals 1 to 10 refer to like parts in the conventional semiconductor element module and semiconductor device shown in FIG. 8. The package 4 is soldered to the substrate 8 through the through-holes 10 so that its bottom abuts on the mounting plane. However, since the grooved level difference 12 is formed so that the bottom of the package 4 is not brought into contact with the conductor pattern formed on the periphery of the through-holes and solder used for mounting, when the leads 6 are soldered through the through-holes 10, a part of molten solder will not flow into the slight gap formed between the package bottom and substrate by the capillary phenomenon and hence the leads will not be short-circuited with each other.

Embodiment 2

Figure 3A:
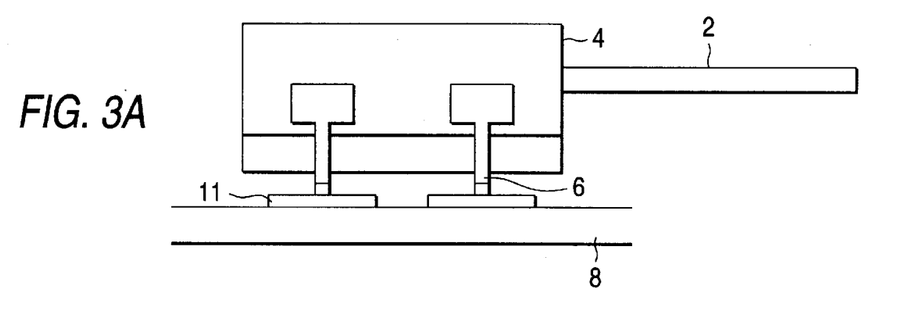
FIGS. 3A and 3B are a side view and a front view of a semiconductor device in which a semiconductor module according to a second embodiment is mounted on a substrate through the conductor patterns provided on the substrate, respectively.
Figure 3B:
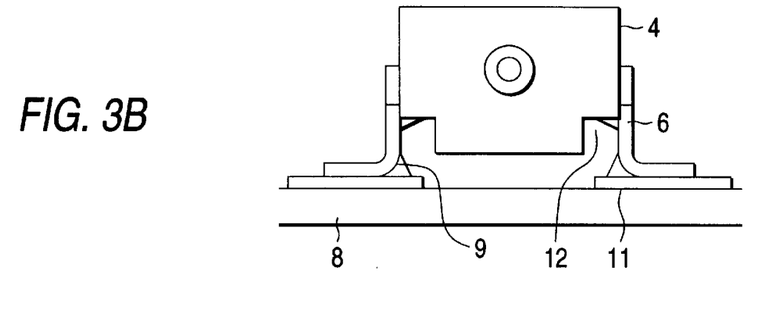

FIG. 3A is a side view of a semiconductor device in which a semiconductor element module according to the present invention is mounted on a substrate through a conductor pattern formed on a mounting plane of the substrate. FIG. 3B is a front view thereof. In these figures, reference numerals 1–9 and 11 refer to like parts in the conventional semiconductor element module and semiconductor device shown in FIG. 9. Reference numeral 12 corresponds to the grooved level differences shown in FIGS. 1A to 1C and 2A, 2B. The package 4 is soldered to the substrate 8 through the conductor pattern so that its bottom forms a prescribed space from a mounting plane of the substrate. In this case, since the grooved level difference 12 is formed so that a gap is provided between the bottom of the package 4 and the solder 7, the brazing material 7 is located apart from the package bottom. Hence, the lead can be bent outwardly at a portion thereof near to the package bottom. In mounting, even if the lead 6 is bent outwardly at the position near to the bottom of the package 4, the package can be mounted without attenuating the connecting strength between the package 4 and the lead. Thus, the height of the semiconductor device after mounting can be lowered compared with the conventional semiconductor device.

Embodiment 3

Figure 4A:
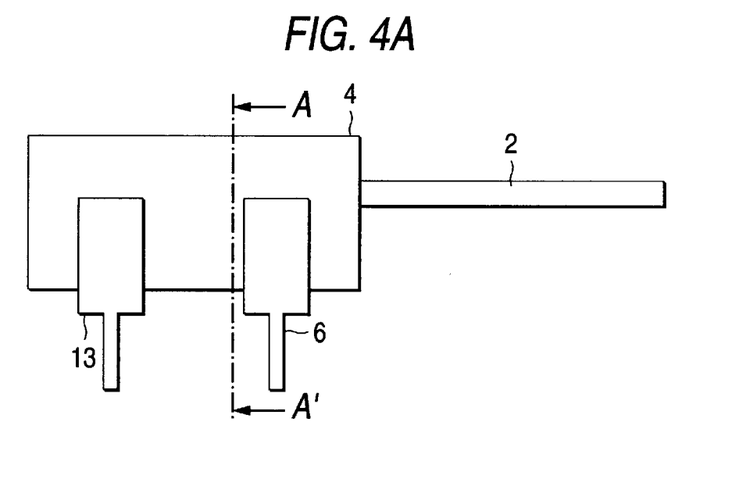
FIGS. 4A to 4C are a side view, a sectional view thereof and a front view taken in line A—A' of a semiconductor module according to a third embodiment of the present invention, respectively.
Figure 4B:
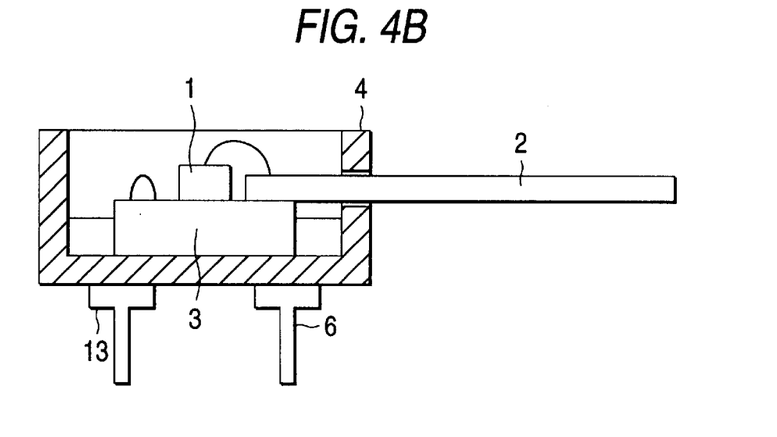
Figure 4C:
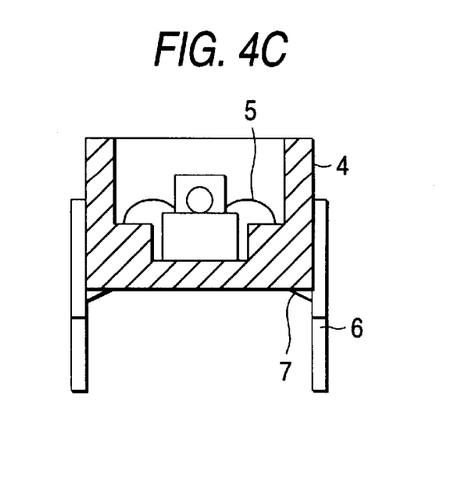
Figure 5A:
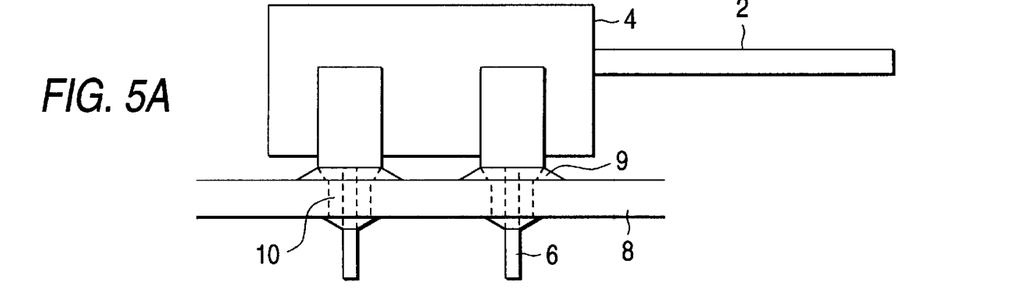
FIGS. 5A and 5B are a side view and a front view of a semiconductor device in which a semiconductor module according to the third embodiment is mounted on a substrate through the through-holes formed therein, respectively.
Figure 5B:
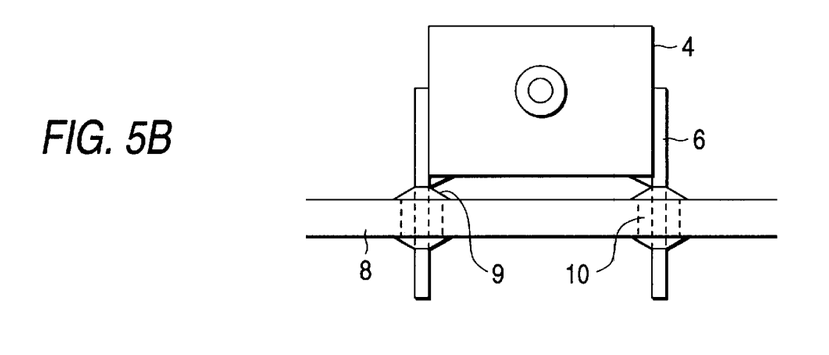

FIG. 4A is a side view showing the third embodiment according to the present invention. FIG. 4B is a sectional view of FIG. 4A. FIG. 4C is a front view taken in line A—A' of FIG. 4A. In these figures, reference numerals 1 to 7 refer to like parts of the conventional element module and semiconductor device. Reference numeral 13 denotes one of lead level differences, provided at a portion of the lead 6 not connected to the package 4 so that the side where the lead 6 and the package 4 are connected is thick while the side of the opening end is thin. FIG. 5A is a side view of a semiconductor device in which the semiconductor element module is mounted on the substrate through through-holes therein. FIG. 5B is a front view thereof. In these figures, reference numerals 1 to 10 refer to like parts of the conventional semiconductor element module and semiconductor device shown in FIGS. 7 and 8. In this case, the above lead level difference 13 is provided so that its width on the side where the lead 6 and package 4 are connected is larger than the hole diameter of the through-hole 10 and that on the side of its opening end is smaller than that of the through-hole 10. The package 4 is soldered to the substrate 8 through the through-holes 10 so that the level difference of the lead 6 abuts on the mounting plane. In this case, since the lead level difference 13 is formed at the portion of the lead 6 not connected to the package 4 so that the bottom of the package 4 is not brought into contact with the conductor pattern formed on the periphery of the through-holes and solder for the lead and through-hole used for mounting. Thus, when a part of the molten solder will not flow into the slight gap formed between the package bottom and substrate 8 by the capillary phenomenon and hence the leads will not be short-circuited with each other.

Embodiment 4

Figure 6A:
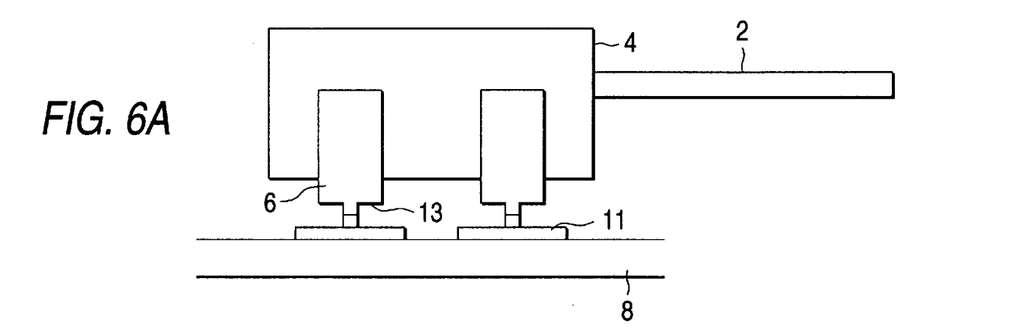
FIGS. 6A and 6B are a side view and a front view of a semiconductor device in which a semiconductor module according to the fourth embodiment is mounted on a substrate through the conductor patterns provided on the substrate, respectively.
Figure 6B:
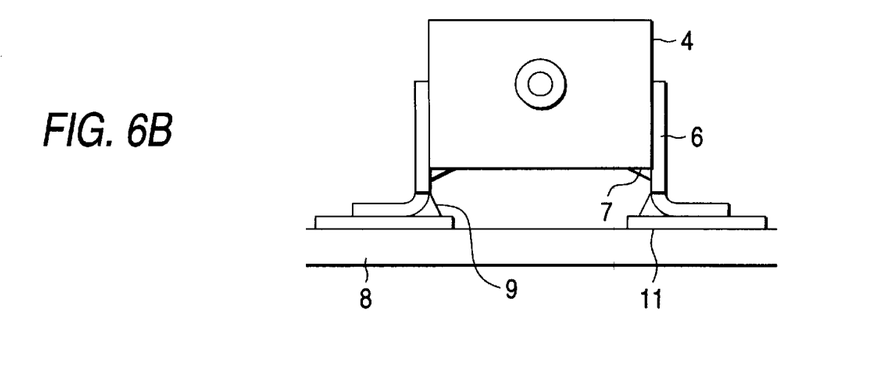

FIG. 6A is a side view showing a semiconductor device in which a semiconductor module according to the present invention is mounted on a substrate through a conductor patterns formed therein. FIG. 6B is a front view thereof. In these figures, reference numerals 1 to 9 and 11 refer to like parts of the conventional element module and semiconductor device shown in FIG. 9. Reference numeral 13 denotes one of lead level differences similar to that in FIGS. 4A to 4C and 5A, 5B. The package 4 is soldered to the substrate through the conductor patterns 11 so that its bottom forms a prescribed space with a mounting plane (i.e. upper surface of the substrate 8). In this case, the lead level difference 13 is formed to provide different mechanical strengths according to the diameter of the lead. Therefore, in mounting, even when the thin portion of the lead 6 is bent abruptly at the position near to the lead level difference 13, the thick portion of the lead 6 will not bend largely. Thus, the package 4 can be mounted on the substrate without attenuating the connecting strength between the package 4 and lead 6, thereby decreasing the height after mounting as compared with the case in the prior art.

Embodiment 5

In the first to fourth embodiments, an explanation will be separately given of the case where the lead is soldered to the substrate 8 through the through-hole 10 formed therein (first and third embodiments), and the case where the lead 6 is soldered to the substrate 8 through the conductor pattern (second and fourth embodiment). However, where these cases are combined, e.g. where the lead is soldered through the conductor pattern provided on the mounting plane of the substrate, the semiconductor device can provide a more excellent high frequency characteristic. For this reason, the lead(s) requiring the high frequency characteristic may be soldered through the conductor pattern provided on the mounting plane of the substrate while the remaining lead(s) may be soldered through the through-hole located on the substrate to position the semiconductor element module, thus providing the same effect.

Embodiment 6

In the first to fifth embodiments, an explanation has been given of the case where the semiconductor element is an optical element, the semiconductor element may be an IC to provide the same effect.

In accordance with the present invention, a semiconductor element module and a semiconductor device can be provided which can prevent solder used for mounting from flowing in between the bottom of the package and substrate when the semiconductor element module is mounted on the substrate through the through-holes formed therein.

Further, in accordance with the present invention, a semiconductor element module and a semiconductor device can be provided which can lower the height after mounting when the semiconductor element module is mounted on the substrate through the conductor patterns provided on the mounting plane of the substrate.

What is claimed is:

1. A semiconductor element nodule, comprising:

a package having a base and opposing side surfaces;

a semiconductor element arranged within said package; and a plurality of leads extending along said side surfaces of the package with an open end of each of said leads extending at least to a package attaching plane, wherein each of said leads is soldered to said substrate and electrically connected through said package to said semiconductor element and serving to connect said semiconductor element to an external circuit;

wherein said base is shaped to form an extended portion providing a level difference along the base portion between said package and the plurality of leads proximate said package attaching plane so that a space is formed between the leads and the package; and wherein said level difference serves to avoid capillary flow of solder to prevent shore-circuiting between the leads adjacent to each other.

2. A semiconductor device, comprising:

a semiconductor element module according to claim 1; and a substrate having conductor patterns and through-holes for connecting the conductor patterns to each other, wherein each of said leads is soldered to the substrate through an operative one of said through-holes so that the bottom of said package abuts on a mounting plane of the substrate.

3. A semiconductor device, comprising a semiconductor element module including:

a substrate;

a package having a base and opposing side surfaces:

a semiconductor element arranged within said package; and a plurality of leads extending along said side surfaces of the package with an open end of each of said leads extending at least to a package attaching plane, wherein each of said leads is soldered to said substrate and electrically connected through said package to said semiconductor element and serving to connect said semiconductor clement to an external circuit;

wherein said base is shaped to form an extended portion providing a level difference along the base portion between said package and the plurality of leads proximate said package attaching plane so that a space is formed between the leads and the package; and a substance having conductor patterns for lead connection on a mounting plane thereof wherein each of said leads is soldered to the substrate through holes in each of said conductor patterns so that the bottom of said package forms a prescribed space from the mounting plane to avoid capillary flow of solder.

4. A semiconductor element module, comprising:

a substrate;

a package having a base and opposing side surfaces;

a semiconductor element arranged within said package;

a plurality of leads extending along said side surfaces of the package with an open end of each of said leads extending at least to a package attaching plane, wherein each of said leads is soldered to said substrate and electrically connected through said package to said semiconductor element and serving to connect said semiconductor element to an external circuit; and brazing material for connecting said package and each of said leads;

wherein said base is shaped to form an extended portion providing a level difference along the base portion between said package and the plurality of leads proximate said package attaching plane so that a space is formed between the leads and the package; and wherein said level difference permits each of said leads to be shaped proximate said package to avoid capillary flow of solder and prevent short-circuiting between the leads adjacent to each other.

5. A semiconductor element module, comprising:

a substrate;

a package having a base and opposing side surfaces;

a semiconductor element arranged within said package; and a plurality of leads extending along said side surfaces of the package with an open terminal of each of said leads extending at least to a package attaching plane, wherein each of said leads is soldered to said substrate and electrically connected through said package to said semiconductor element and serving to connect said semiconductor element to an external circuit;

wherein a shape of said leads provides a level difference along the base portion between said package and the plurality of leads proximate said package attaching plane, said shape being such that a space is formed between the leads and the package; and wherein said level difference serves to avoid capillary flow of solder to prevent short-circuiting between the leads adjacent to each other.

6. A semiconductor device comprising a semiconductor element module according to claim 5 and a substrate having conductor patterns and through-holes for connecting the conductor patterns to each other wherein each of said leads is soldered to the substrate through each said through-holes so that said level difference of each of said leads abuts on a mounting plane of the substrate.

7. A semiconductor device comprising a semiconductor element module including:

a substrate;

a package having a base and opposing side surfaces;

a semiconductor element arranged within said package; and a plurality of leads extending along said side surfaces of the package with an open terminal of each of said leads extending at least to a package attaching plane, wherein each of said lead, is soldered to said substrate and electrically connected through said package to said semiconductor element and serving to connect said semiconductor element to an external circuit;

wherein a shape of said leads provides a level difference along the base portion between said package and the plurality of leads proximate said package attaching plane, said shape being such that a space is formed between the leads and the package; and a substrate having conductor patterns for lead connection on a mounting plane thereof wherein each of said leads is soldered to the substrate through holes in each of said conductor patterns so that the bottom of said package forms a prescribed space from the mounting plane; and wherein said level difference serves to avoid capillary flow of solder to prevent short-circuiting between the leads adjacent to each other.

8. A semiconductor element module comprising:

a substrate;

a package having a base and opposing side surfaces;

a semiconductor element arranged within said package;

a plurality of leads extending along said side surfaces of the package with an open terminal of each of said leads extending at least to a package attaching plane, wherein each of said leads is soldered to said substrate and electrically connected through said package to said semiconductor element and serving to connect said semiconductor element to an external circuit;

brazing material for connecting said package and each of said leads;

wherein a shape of said leads provides a level difference along the base portion between said package and the plurality of leads proximate said package attaching plane, said shape being such that a space is formed between the leads and the package; and wherein said level difference provides different mechanical strengths permitting each of said leads to be bent proximate said package to avoid capillary flow of solder and prevent short-circuiting between the leads adjacent to each other.

9. A semiconductor element module according to claim 1, wherein said semiconductor element is an optical element.

10. A semiconductor element module according to claim 5, wherein said semiconductor element is an optical element.

* * * * *